(12) United States Patent
Nelson

(10) Patent No.: US 11,114,400 B2
(45) Date of Patent: Sep. 7, 2021

(54) SEMICONDUCTOR DEVICE WITH IMPROVED THERMAL DISSIPATION AND MANUFACTURING METHODS

(71) Applicant: Amkor Technology Singapore Holding Pte. Ltd., Singapore (SG)

(72) Inventor: Cameron Nelson, Gilbert, AZ (US)

(73) Assignee: AMKOR TECHNOLOGY SINGAPORE HOLDING PTE.LTD., Singapore (SG)

( * ) Notice: Subject to any disclaimer, the term of this patent is extended or adjusted under 35 U.S.C. 154(b) by 0 days.

(21) Appl. No.: 16/123,377

(22) Filed: Sep. 6, 2018

(65) Prior Publication Data

US 2020/0083186 A1 Mar. 12, 2020

(51) Int. Cl.
*H01L 23/00* (2006.01)
*H01L 23/36* (2006.01)
*H01L 23/31* (2006.01)

(52) U.S. Cl.
CPC .......... *H01L 24/06* (2013.01); *H01L 23/3171* (2013.01); *H01L 23/36* (2013.01); *H01L 24/03* (2013.01); *H01L 24/13* (2013.01); *H01L 2224/024* (2013.01); *H01L 2224/0239* (2013.01); *H01L 2224/02331* (2013.01); *H01L 2224/02377* (2013.01); *H01L 2224/02379* (2013.01); *H01L 2224/02381* (2013.01); *H01L 2224/039* (2013.01); *H01L 2224/06519* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13147* (2013.01); *H01L 2924/014* (2013.01); *H01L 2924/01028* (2013.01)

(58) Field of Classification Search
CPC ...... H01L 23/3171; H01L 23/36; H01L 24/06
See application file for complete search history.

(56) References Cited

U.S. PATENT DOCUMENTS

| | | | |
|---|---|---|---|
| 7,977,783 B1 * | 7/2011 | Park | ................. H01L 24/11 257/692 |
| 2009/0057880 A1 * | 3/2009 | Baek | ................. H01L 25/0657 257/713 |

(Continued)

*Primary Examiner* — Sarah K Salerno
(74) *Attorney, Agent, or Firm* — McAndrews, Held & Malloy, Ltd.

(57) ABSTRACT

A semiconductor device includes a semiconductor die, a redistribution structure, a interconnection structure, and a thermal path structure. The redistribution structure includes an insulation layer over a first surface of the semiconductor die and a conductive trace separated from the first surface by the insulation layer. The conductive trace extends laterally over the first surface from a first end toward a second end that is electrically coupled to a bond pad on the first surface of the semiconductor die. The interconnection structure is coupled to the first end of the conductive trace. The thermal path structure provides a thermal path between the semiconductor die and the interconnection structure. In some embodiment, the thermal path structure comprises a thermal pad that passes through the insulation layer. In other embodiments, the thermal path structure comprises a dummy pad on the first surface of the semiconductor die.

23 Claims, 4 Drawing Sheets

(56) References Cited

U.S. PATENT DOCUMENTS

2012/0161129 A1\* 6/2012 Chen ................. H01L 22/32
  257/48
2015/0311169 A1\* 10/2015 Chuang .............. H01L 21/56
  438/107
2016/0329262 A1\* 11/2016 Hsiao ................. H01L 24/19

\* cited by examiner

SEMICONDUCTOR DEVICE WITH IMPROVED THERMAL DISSIPATION AND MANUFACTURING METHODS

FIELD OF THE DISCLOSURE

Various aspects of the present disclosure relate to semiconductor devices and manufacturing methods thereof.

BACKGROUND

Prior semiconductor devices and methods for forming semiconductor devices are inadequate, for example resulting in excess cost, decreased reliability, relatively low performance, poor thermal properties, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

Common reference numerals are used throughout the drawings and the detailed description to indicate the same and/or similar elements.

DETAILED DESCRIPTION

Figure 1:
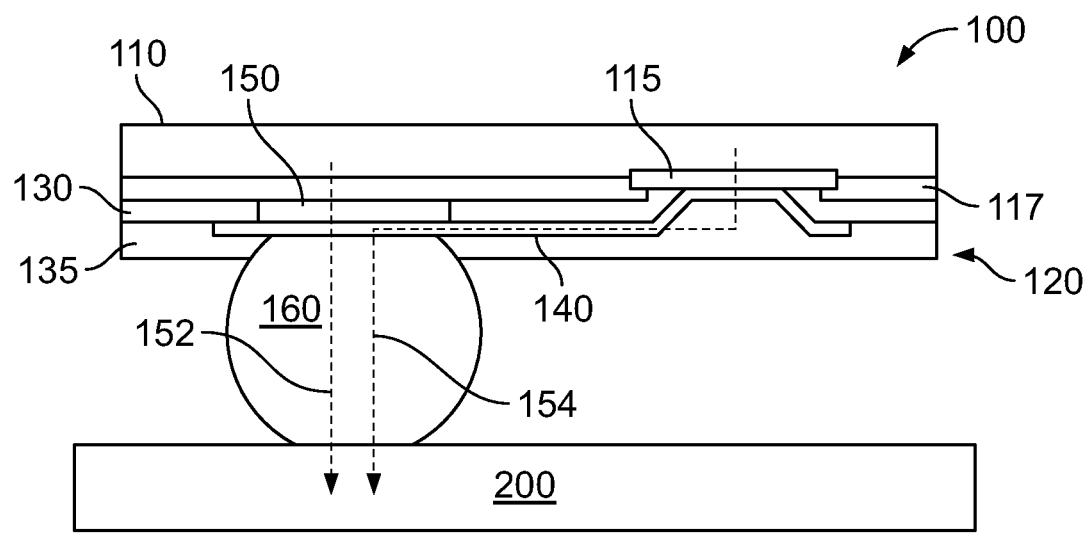
FIG. 1 provides a cross-sectional view of an embodiment of a semiconductor device fabricated in accordance with the present disclosure.

Various aspects of the present disclosure can be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

According to various embodiments of the present disclosure, a semiconductor device includes a semiconductor die, a redistribution structure, and interconnection structure, and a thermal pad. The semiconductor die includes a first surface, a bond pad on the first surface, and an integrated circuit electrically coupled to the bond pad. The redistribution structure includes an insulation layer over the first surface of the semiconductor die and a conductive trace separated from the first surface by the insulation layer. The conductive trace extends laterally over the first surface from a first end toward a second end that is electrically coupled to the bond pad. The interconnection structure is coupled to the first end of the conductive trace. The thermal pad passes through the insulation layer and provides a thermal path between the semiconductor die and the interconnection structure coupled to the first end of the conductive trace.

According to further embodiments of the present disclosure, a semiconductor device includes a semiconductor die, a redistribution structure, and an interconnection structure. The semiconductor die include a first surface, an integrated circuit, a bond pad on the first surface that is electrically coupled to the integrated circuit, and a dummy pad on the first surface that is not electrically coupled to the integrated circuit. The redistribution structure includes an insulation layer over the first surface of the semiconductor die and a conductive trace separated from the first surface by the insulation layer. The conductive trace extends laterally over the first surface from a first end coupled to the dummy pad toward a second end coupled to the bond pad. The interconnection structure is coupled to the first end of the conductive trace. The dummy pad and the conductive trace provide a first thermal path between the semiconductor die and the interconnection structure. The bond pad and the conductive trace provide a second thermal path between the semiconductor die and the interconnection structure.

According to yet other embodiments of the present disclosure, a method of fabricating a semiconductor device includes forming an insulation layer on a first surface of a semiconductor die comprising an integrated circuit electrically coupled to a bond pad on the first surface. The method also includes forming a thermal path structure on the first surface of the semiconductor die, and forming a conductive trace on the insulation layer such that a first end of the conductive trace is coupled to the thermal path structure and a second end of the conductive trace is coupled to the bond pad. The method further includes attaching an interconnection structure to the first end of the conductive trace to form a first thermal path to the interconnection structure via the thermal path structure and a second thermal path to the interconnection via the bond pad, wherein the first thermal path provides a greater thermal conductivity than the second thermal path.

In the drawings, the thickness of layers and regions are exaggerated for clarity. Like reference numerals refer to like elements throughout. As used herein, the term "and/or" includes any and all combinations of one or more of the associated listed items. It will also be understood that when an element A is referred to as being "connected to" an element B, the element A can be directly connected to the element B or an intervening element C can be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise," "include," "comprising," and "including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. can be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, are used herein for ease of description to describe a relationship of an element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein can be interpreted accordingly.

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures can be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between surfaces. As used herein, the term "coplanar" includes surfaces having a step-off ranging between 0 and 7 microns.

Referring to FIG. 1, a cross-sectional view of a semiconductor device 100 according to an embodiment of the present disclosure is shown. As shown in FIG. 1, the semiconductor device 100 can include a semiconductor die 110, a redistribution structure 120, and one or more interconnection structures 160. The interconnection structures 160 can electrically couple an integrated circuit of the semiconductor die 110 to another device 200 such as a printed circuit board, a semiconductor package, semiconductor die, a package substrate, etc. Moreover, as explained in greater detail below, a thermal path structure such as a thermal pad 150 can thermally-couple an interconnection structure 160 to the semiconductor die 110 in order to provide a thermal path 152 for transferring thermal energy away from the semiconductor die 110 to the device 200.

Figure 2A:
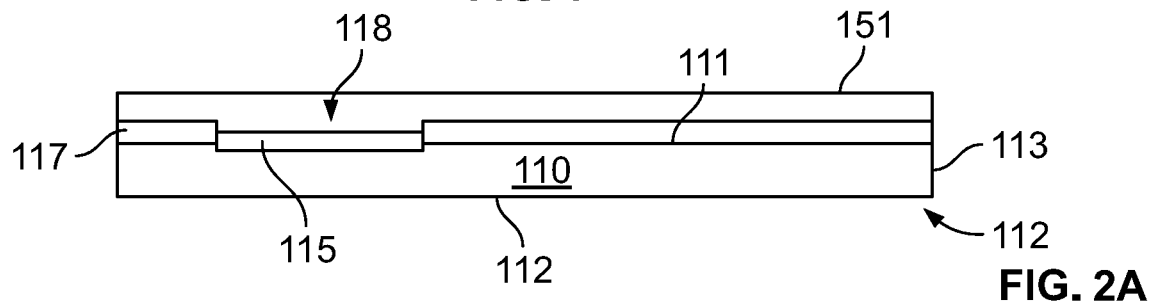
FIGS. 2A-2H depict an example process for fabricating the semiconductor device of FIG. 1.

As shown in FIG. 2A, the semiconductor die 110 can include a first surface 111, a second surface 112 opposite the first surface 111, and one or more side surfaces or sidewalls 113. The first surface 111 and the second surface 112 can each provide a generally planar surface. Moreover, the first surface 111 can be parallel to the second surface 112. The sidewalls 113 can join the first surface 111 to the second surface 112. In some embodiments, the sidewalls 113 can provide generally planar surfaces that are perpendicular to the first surface 111 and the second surface 112.

The semiconductor die 110 can include any of a variety of types of integrated circuits. For example, the semiconductor die 110 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc.

The semiconductor die 110 can further include a plurality of a bond pads 115 along its first surface 111. Only a single bond pad 115 is shown in FIGS. 1 and 2A-2H in the interest of improving legibility of such figures. The bond pads 115 can be electrically coupled to the integrated circuits of the semiconductor die 110 in order to provide an electrical interface to the integrated circuits of the semiconductor die 110.

The semiconductor die 110 can further include a passivation layer 117 along its first surface 111. In some examples, the exposed side of passivation layer 117 can be considered part of first surface 111 of semiconductor die 110. In some embodiments, the second surface 112 and/or sidewalls 113 likewise include a passivation layer. Openings 118 in the passivation layer 117 can expose surfaces 116 of the bond pads 115 to permit the redistribution structure 120 to electrically interface the integrated circuits via the bond pads 115. See, e.g., FIG. 2B.

The passivation layer 117 can include an inorganic dielectric such as a silicon oxide film ($SiO_2$) or a silicon nitride film ($Si_3N_4$), and/or other dielectric material. In some embodiments, the passivation layer 117 is very thin compared to the other layers of the semiconductor device 100. For example, the passivation layer 117 can have a thickness of 1 μm or less. Thus, while the passivation layer 117 can have a poor thermal conductivity (e.g., less than 0.2 Watts per meter-Kelvin (W/m*K)), thermal energy can readily pass through the passivation layer 117 due to the passivation layer 117 being thin.

The redistribution structure 120 can electrically couple interconnection structures 160 to the bond pads 115 of the semiconductor die 110. To this end, the redistribution structure 120 can include a first insulation layer 130 that covers the passivation layer 117. Like the passivation layer 117, the first insulation layer 130 can include openings 132. The openings 132 in the first insulation layer 130 can expose surfaces 116 of the bond pads 115. See, e.g. FIG. 2D. Such openings 132 can permit one or more conductive traces 140 to electrically interface the integrated circuits of the semiconductor die 110 via the bond pads 115.

The first insulation layer 130 can include Polylmide (PI), Benzo Cyclo Butene (BCB), Poly Benz Oxazole (PBO), BismaleimideTriazine (BT), phenolic resin, epoxy, Silicone (Si), silicon oxide film ($SiO_2$), silicon nitride film ($Si_3N_4$), and/or other electrical insulator materials. The thickness of the first insulation layer 130 can range between about 3 micrometers (μm) and about 15 μm. If the thickness of the first insulation layer 130 is less than 3 μm, absorption efficiency of mechanical stress that is delivered from an external device to the interconnection structures 160 is reduced. Further, a thickness of the first insulation layer 130 of greater than 15 μm can excessively increase the overall thickness of the semiconductor device 100.

One or more conductive traces 140 can traverse an upper surface 134 of the first insulation layer 130. See, e.g., FIG. 2E. In some examples, conductive trace 140 can represent or be referred as a conductive path between bond pad 115 and land portion 144, where the conductive path can comprise one or more conductive layers at a single level as shown, or can comprise conductive layers stacked upon and connected to each other across multiple levels with corresponding insulation layers therebetween. The conductive traces 140 can electrically connect the bond pads 115 to the interconnection structures 160. In particular, the conductive traces 140 can provide fan-in and/or fan-out redistribution between the bond pads 115 and the interconnection structures 160 so as to distribute the interconnection structures 160 along an external surface of the semiconductor device 100 in a grid pattern. In some embodiments, the conductive traces 140 can include be formed from one or more copper plated layers, nickel plated layers, and/or some other electrical conductive layers. Each of the conductive layers can have a thickness ranging between about 1 μm and about 4 μm.

The redistribution structure 120 can further include a second insulation layer 135. The second insulation layer 135 can traverse the upper surface 134 of the first insulation layer 130 and upper surfaces 142 of the conductive traces 140. See, e.g., FIG. 2F. In particular, the second insulation layer 135 can generally cover the conductive traces 140 in order to prevent oxidation and contamination of the conductive traces 140. The second insulation layer 135 can further include one or more openings 137 in order to expose land portions 144 of the conductive traces 140. See, e.g., FIG. 2G.

In addition, the thickness of the second insulation layer 140 can range between about 3 μm and about 15 μm. The second insulation layer 140 can be formed of Polylmide (PI), Benzo Cyclo Butene (BCB), Poly Benz Oxazole (PBO), Bismaleimide Triazine (BT), phenolic resin, epoxy, Silicone (Si), silicon oxide film ($SiO_2$), silicon nitride film ($Si_3N_4$), Epoxy Mold Compound (EMC), and/or other electrical insulator materials.

Although the figures show redistribution structure 120 as having a single level of conductive traces 140, there can be embodiments with multiple levels of conductive traces 140 stacked upon each other, with a corresponding insulation layer similar to insulation layer 130 or 135 between each level.

The redistribution structure 120 can further include one or more thermal path structures such as thermal pads 150. The thermal pads 150 can be positioned between the land portions 144 of the conductive traces 140 and the semiconductor die 110 to provide a thermal path 152 between the semiconductor die 110 and the land portions 144. See, e.g., FIG. 2G. In particular, the thermal pads 150 provides a greater thermal conductivity than the first insulation layer 130. In this manner, the thermal path 152 provided by the thermal pad 150 has a thermal conductivity that is greater than a thermal conductivity provided by the first insulation layer 130 in the absence of the thermal pad 150.

Each thermal pad 150 can have a right cylindrical structure with a first end 156 and a second end 158. The first end 156 of the cylindrical structure can directly contact the land portion 144 of the conductive trace 140. The second end 158 of the cylindrical structure can directly contact first surface 111 of semiconductor die 110, such as at passivation layer 117. See, e.g., FIG. 2G.

The interconnection structures 160 can include a solder ball, bump, pads, pins, pillar, post, or some other electrically conductive structure suitable for electrically connecting the semiconductor device 100 to another device such as device 200. In particular, the interconnection structures 160 can be attached to or formed on the land portions 144 of the conductive traces 140, which are externally exposed through the openings 137 in the second insulation layer 135. Such interconnection structures 160 can be used to deliver electrical signals between integrated circuits of the semiconductor die 110 and an external device such as device 200. See, e.g., FIGS. 1 and 2H.

In some embodiments, the interconnection structures 160 include solder balls roughly in the shape of a sphere. Such solder balls can be attached to the land portions 144. Moreover, the solder balls can be formed of tin (Sn), SnPb, SnPbAg, SnPbBi, SnCu, SnAg, SnBi, SnAgCu, SnAgBi, SnZn, and/or some other tin compound. In some embodiments, the solder balls can be doped with nickel (Ni), with a doping density of nickel (Ni) less than about 1% by weight. There can also be embodiments where interconnection structures 160 can comprise a metallic pillar or post, such as a copper pillar, that can be placed or formed, such as by plating, over land portions 144.

Referring now to FIGS. 2A-2H, an exemplary process of fabricating the semiconductor device 100 of FIG. 1 is presented. The following process depicts a single bond pad 115, a single conductive trace 140, and a single thermal pad 150 in the interest of figure legibility and description clarity. However, the described processes for forming the depicted bond pad 115, conductive trace 140, and thermal pad 150 can be used to concurrently form additional bond pads, conductive traces, and/or thermal pads along with the depicted bond pad 115, conductive trace 140, and thermal pad 150.

Referring to FIG. 2A, a semiconductor die 110 with an integrated circuit can be formed with a bond pad 115 on a first surface 111 of the semiconductor die 110 such that bond pad 115 is electrically coupled to the integrated circuit. Furthermore, a passivation layer 117 can be formed on the first surface 111 of the semiconductor die 110. The passivation layer 117 can be formed with an opening 118 that exposes an upper surface 116 of the bond pad 115. Alternatively, the passivation layer 117 can be formed over the bond pad 115 and an opening 118 can be later formed in the passivation layer 117 to expose an upper surface 116 of the bond pad 115.

As further shown in FIG. 2A, a thermally-enhanced insulation layer 151 can be formed over the passivation layer 117 and bond pad 115. The thermally-enhanced insulation layer 151 has a thermal conductivity greater than the thermal conductivity of the first insulation layer 130. In particular, the thermally-enhanced insulation layer 151 can include a dielectric material and can have a thermal conductivity of at least 0.2 W/m*K, of at least 0.4 W/m*K, or of at least 0.7 W/m*K. To this end, the thermally-enhanced insulation layer 151 can be formed using DuPont™ Kapton® MT polyimide film, which provides a thermal conductivity of 0.46 W/m*K or DuPont™ Kapton® MT+ polyimide film, which provides a thermal conductivity of 0.75 W/m*K.

Figure 2B:
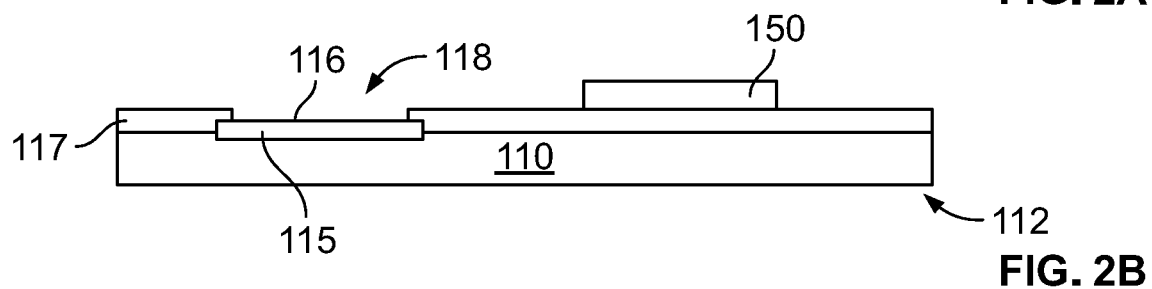

A thermal pad 150 can then be formed from the thermally-enhanced insulation layer 151 as shown in FIG. 2B. To this end, the thermally-enhanced insulation layer 151 can be subjected to a masking and etching process which removes the thermally-enhanced insulation layer 151 from the bond pad 115 and portions of the passivation layer 117, but retains a portion of the thermally-enhanced layer 151 to form the thermal pad 150.

Figure 2C:
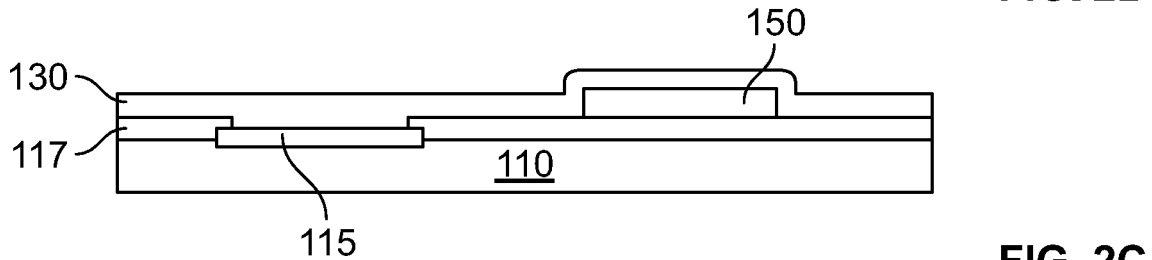
Figure 2D:
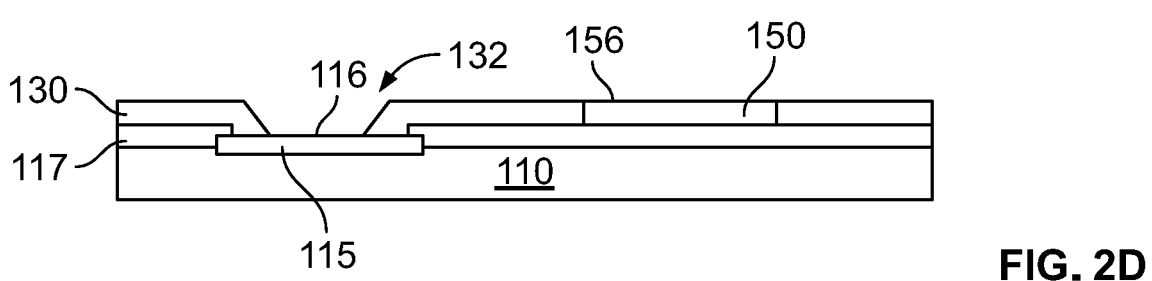
Figure 2E:
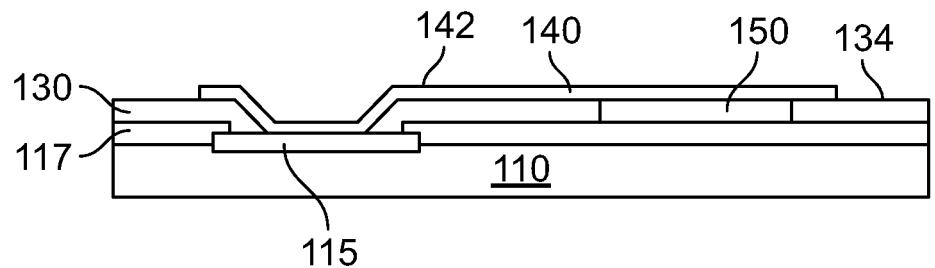

As shown in FIG. 2C, a first insulation layer 130 can be formed over the bond pad 115, the passivation layer 117, and the thermal pad 150. The first insulation layer 130 can then be planarized, masked, and etched to remove the first insulation layer 130 from the upper surface 116 of the bond pad 115 and the upper surface 156 of the thermal pad 150. In particular, an opening 132 can be formed which exposes the upper surface 116 of the bond pad 115. As such, the upper surface 116 of the bond pad 15 and the upper surface 156 of the thermal pad 155 can be exposed through the first insulation layer 130 as shown in FIG. 2D.

Further, a conductive layer comprising one or more layers of conductive material can be formed over the bond pad 115, the first insulation layer 130, and the thermal pad 150. The conductive layer can be masked and etched to form a conductive trace 140 that extends across the first insulation layer 130 from a first end in contact with the thermal pad 150 to a second end in contact with the bond pad 115. See, FIG. 2E. In some embodiments, a seed layer (not shown) can be formed over the bond pad 115, the first insulation layer 130, and thermal pad 150 before forming the one or more conductive layers. The seed layer can aid in forming the conductive layers via various plating techniques. The seed layer can be formed by depositing a metal on the bond pad 115, the first insulation layer 130, and the thermal pad 150 using sputtering, chemical vapor deposition (CVD), or plasma enhanced chemical vapor deposition (PECVD).

Figure 2F:
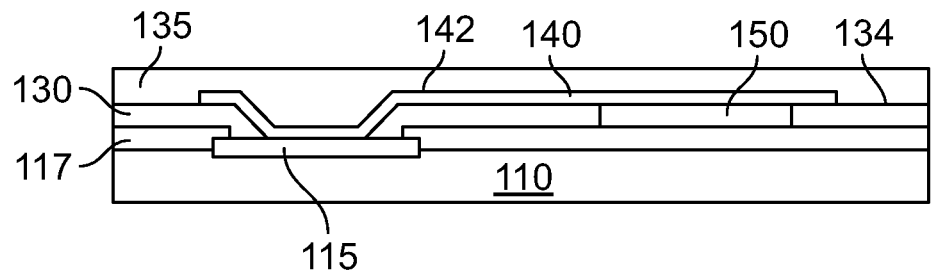
Figure 2G:
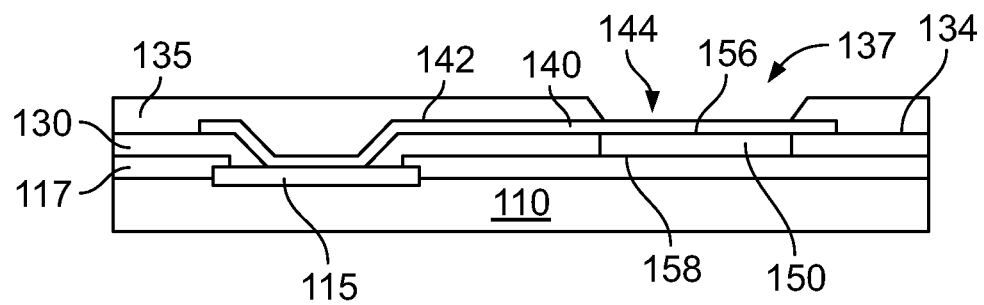

As shown in FIG. 2F, a second insulation layer 135 can be formed over the first insulation layer 130 and the conductive trace 140. The second insulation layer 135 can be formed by molding, printing, spin coating, or dispensing at least one material selected from the group consisting of an epoxy molding compound (EMC), polyimide (PI), benzocyclobutene (BCB), polybenzoxazole (PBO), bismaleimidetriazine (BT), phenolic resin, and equivalents thereof, to the first insulation layer 130 and the conductive trace 140.

Figure 2H:
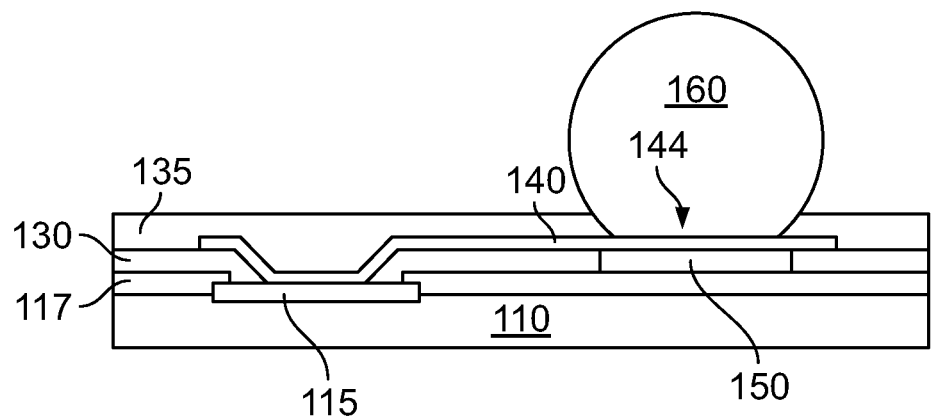

The second insulation layer 135 can be masked and etched to expose a land portion 144 of the conductive trace 140 positioned above the thermal pad 150. See, FIG. 2G. As shown in FIG. 2H, an interconnection structure 160 can be attached or formed over the land portion 144. In some examples, a cap layer or under-bump metallization (UBM) similar to cap layer 146 (FIG. 4G) can be applied over land portion 144, and interconnection structure 160 can be attached or formed over such cap or UBM layer. There can be embodiments where interconnection structure 160 can include a substantially spherical solder ball fusibly attached to the land portion 144 of the conductive trace 140. In an exemplary embodiment, a viscous flux (not shown) can be applied to the land portion 144 for positioning a solder ball thereon. Then, the semiconductor die 110 can be placed into a furnace maintained at a temperature ranging from about 150° C. to about 250° C. and then taken out to evaporate the flux for removal, thereby fusibly attaching the spherical solder ball to the land portion 144 of the conductive trace 140. There can also be embodiments where interconnection structures 160 can comprise a metallic pillar or post, such as a copper pillar, that can be placed or formed, such as by plating, over land portions 144.

Figure 3:
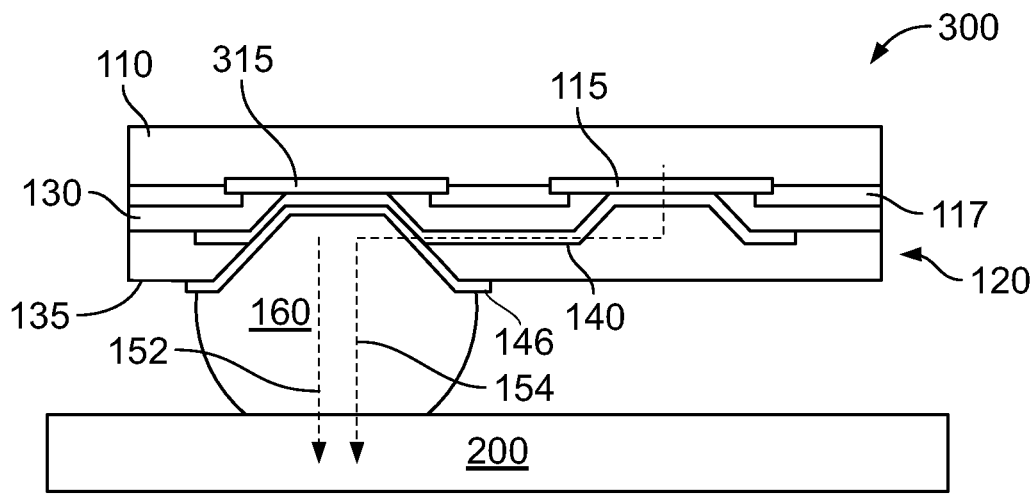
FIG. 3 provides a cross-sectional view of another embodiment of a semiconductor device fabricated in accordance with the present disclosure.

Referring to FIG. 3, a cross-sectional view of a semiconductor device 300 according to another embodiment of the present disclosure is shown. Semiconductor device 300 may be implemented in a similar manner as semiconductor device 100 of FIG. 1. As such, similar components of the semiconductor devices 100, 300 are referenced with the same reference numerals. Moreover, the following description of the semiconductor device 300 focuses primarily upon the differences between the semiconductor devices. As shown in FIG. 3, the semiconductor device 300, like the semiconductor device 100, can include a semiconductor die 110, a redistribution structure 120, and one or more interconnection structures 160. The interconnection structures 160 can electrically couple an integrated circuit of the semiconductor die 110 to another device 200 such as a printed circuit board, a semiconductor package, semiconductor die, a package substrate, etc. Moreover, a thermal path structure such as a dummy pad 315 can thermally-couple an interconnection structure 160 to the semiconductor die 110 in order to provide a thermal path 152 for transferring thermal energy away from the semiconductor die 110 to the device 200.

Figure 4A:
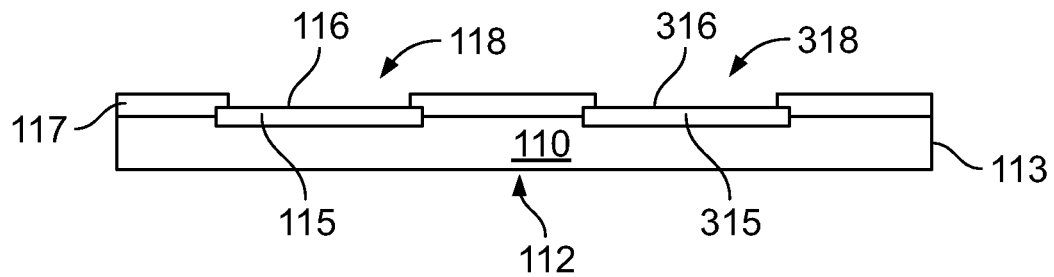
FIGS. 4A-4G depict an example process for fabricating the semiconductor device of FIG. 3.

As shown in FIG. 4A, the semiconductor die 110 can further include a plurality of a bond pads 115 along its first surface 111. Unlike the semiconductor device 100, the semiconductor device 110 of the semiconductor device 300 further includes one or more thermal conductive structures in the form of dummy pads 315 along its first surface 111. Only a single bond pad 115 and a single dummy pad 315 are shown in FIGS. 3 and 4A-4H in the interest of improving figure legibility and description clarity. The bond pads 115 can be electrically coupled to the integrated circuits of the semiconductor die 110 in order to provide an electrical interface to the integrated circuits of the semiconductor die 110. Unlike the bond pads 115, the dummy pads 315 are not electrically coupled to the integrated circuits of the semiconductor die 110. Instead of providing the interconnection structures 160 with an electrical coupling to the integrated circuits of the semiconductor die 110, the dummy pads 315 provide the interconnection structures 160 with another thermal path 152 to the semiconductor die 110. In some embodiments, each dummy pad 315 provides its coupled interconnection structure 160 with a thermal path 152 to the semiconductor die 100 having greater thermal conductivity than a thermal path 154 provided by the bond pad 115 coupled to the interconnection structure 160 via a conductive trace 140.

The semiconductor die 110 can further include a passivation layer 117 along its first surface 111. In some embodiments, the second surface 112 and/or sidewalls 113 likewise include a passivation layer. Openings 118 in the passivation layer 117 can expose surfaces 116 of the bond pads 115 to permit the redistribution structure 120 to electrically interface the integrated circuits via the bond pads 115. Similarly, openings 318 in the passivation layer 117 can expose surfaces 316 of the dummy pads 315 to permit the redistribution structure 120 to thermally interface the semiconductor die 110 via the dummy pads 315. See, e.g., FIG. 4A.

The redistribution structure 120 can electrically and/or thermally couple interconnection structures 160 to the bond pads 115 and dummy pads 313 of the semiconductor die 110. To this end, the redistribution structure 120 can include a first insulation layer 130 that covers the passivation layer 117. Like the passivation layer 117, the first insulation layer 130 can include openings 132. The openings 132 in the first insulation layer 130 can expose surfaces 116 of the bond pads 115. The first insulation layer 130 can include openings 332. The openings 332 in the first insulation layer 130 can expose surfaces 316 of the dummy pads 315. See, e.g., FIG. 4C. Such openings 132, 332 can permit one or more conductive traces 140 to electrically and/or thermally interface the integrated circuits of the semiconductor die 110 via the bond pads 115 and the dummy pads 315.

One or more conductive traces 140 can traverse an upper surface 134 of the first insulation layer 130 and electrically and thermally couple the interconnection structures 160 to the bond pads 115. The one or more conductive traces 140 can further thermally couple the interconnection structures 160 to the dummy pads 315. See, e.g., FIG. 4D. The conductive traces 140 can provide fan-in and/or fan-out redistribution between the bond pads 115 and the conductive interconnection structures 160 so as to distribute the interconnection structures 160 along an external surface of the semiconductor device 300 in a grid pattern. In some embodiments, the conductive traces 140 can be formed from one or more copper plated layers, nickel plated layers, and/or some other electrical conductive layers. Each of the conductive layers can have a thickness ranging between about 1 μm and about 4 μm.

The redistribution structure 120 can further include a second insulation layer 135. The second insulation layer 135 can traverse upper surface 134 of the first insulation layer 130 and upper surfaces 142 of the conductive traces 140. See, e.g., FIG. 4E. In particular, the second insulation layer 135 can generally cover the conductive traces 140 in order to prevent oxidation and contamination of the conductive traces 140. The second insulation layer 135 can further include one or more openings 137 in order to expose land portions 144 of the conductive traces 140. See, e.g., FIG. 4F. As further shown, cap layers 146 can be formed over land portions 144 of conductive traces 140, where cap layers 146 can include one or more copper plated layers, nickel plated layers, and/or some other electrical conductive layers configured to structurally enhance the interface between interconnection structures 160 and land portions 144. In some examples, cap layers 146 can be referred as under-bump metallization (UBM) layers.

The interconnection structures 160 can include a solder ball, pads, pins, or some other electrically conductive structure suitable for electrically connecting the semiconductor device 300 to another device such as device 200. In particular, the interconnection structures 160 can be attached to cap layers 146 on the land portions 144 of the conductive traces 140, which are externally exposed through the openings 137 in the second insulation layer 135. Such interconnection structures 160 can be used to deliver electrical signals between integrated circuits of the semiconductor die 110 and an external device such as device 200. The interconnection structures 160 can further be used to transfer thermal energy from the semiconductor die 110 to the device 200 via dummy pads 315 and bond pads 115. In some embodiments, a dummy pad 315 can provide a interconnection structure 160 with a thermal path 152 having a greater thermal conductivity than a thermal path 154 provided by a bond pad 115 and conductive trace 140 coupled to the interconnection structure 160. See, e.g., FIGS. 3 and 4G.

Referring now to FIGS. 4A-4G, an exemplary process of fabricating the semiconductor device 300 of FIG. 3 is presented. The following process depicts a single bond pad 115, a single conductive trace 140, and a single dummy pad 315 in the interest of figure legibility and description clarity. However, the described processes for forming the depicted bond pad 115, conductive trace 140, a dummy pad 315 can be used to concurrently form additional bond pads, conductive traces, and/or dummy pads along with the depicted bond pad 115, conductive trace 140, and dummy pad 315.

Referring to FIG. 4A, a semiconductor die 110 with an integrated circuit can be formed with a bond pad 115 and dummy pad 315 on a first surface 111 of the semiconductor die 110 such that bond pad 115 is electrically coupled to the integrated circuit and the dummy pad 315 is not electrically coupled to the integrated circuit. Furthermore, a passivation layer 117 can be formed on the first surface 111 of the semiconductor die 110. The passivation layer 117 can be formed with an opening 118 that exposes an upper surface 116 of the bond pad 115 and an opening 318 that exposes an upper surface 316 of the dummy pad 315. Alternatively, the passivation layer 117 can be formed over the bond pad 115 and the dummy pad 315. Later, an opening 118 can be formed in the passivation layer 117 to expose an upper surface 116 of the bond pad 115 and an opening 318 can be formed in the passivation layer 117 to expose an upper surface 316 of the dummy pad 315.

Figure 4B:
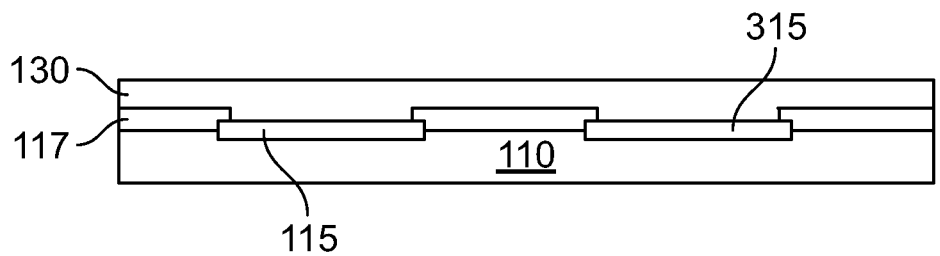
Figure 4C:
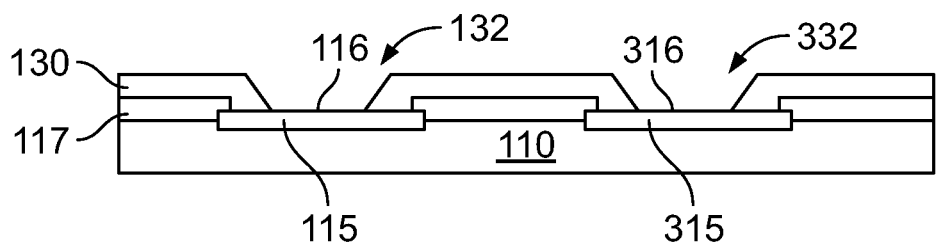
Figure 4D:
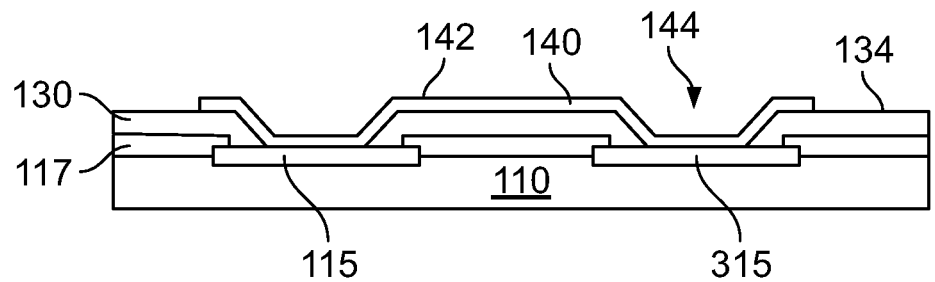

As shown in FIG. 4B, a first insulation layer 130 can be formed over the passivation layer 117, the bond pad 115, and the dummy pad 315. The first insulation layer 130 can then be planarized, masked, and etched to remove the first insulation layer 130 from upper surface 116 of the bond pad 115 and the upper surface 316 of the dummy pad 315. In particular, an opening 132 can be formed which exposes the upper surface 116 of the bond pad 115 and an opening 332 can be formed which exposes the upper surface 316 of the dummy pad 315. As such, the upper surface 116 of the bond pad 115 and the upper surface 316 of the dummy pad 315 can be exposed through the first insulation layer 130 as shown in FIG. 4C.

Further, a conductive layer comprising one or more layers of conductive material can be formed over the bond pad 115, the first insulations layer 130, and the dummy pad 315. The conductive layer can be masked and etched to form a conductive trace 140 that extends across the first insulation layer 130 from a first end in direct contact with the dummy pad 315 to a second end in direct contact with the bond pad 115. See, FIG. 4D. In some embodiments, a seed layer (not shown) can be formed over the bond pad 115, the first insulation layer 120, and dummy pad 315 before forming the one or more conductive layers. The seed layer can aid in forming the conductive layers via various plating techniques. The seed layer can be formed by depositing a metal on the bond pad 115, the first insulation layer 120, and the dummy pad 150 using sputtering, chemical vapor deposition (CVD), or plasma enhanced chemical vapor deposition (PECVD).

Figure 4E:
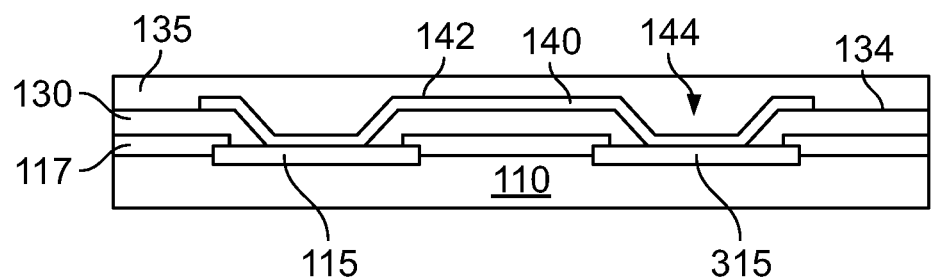
Figure 4F:
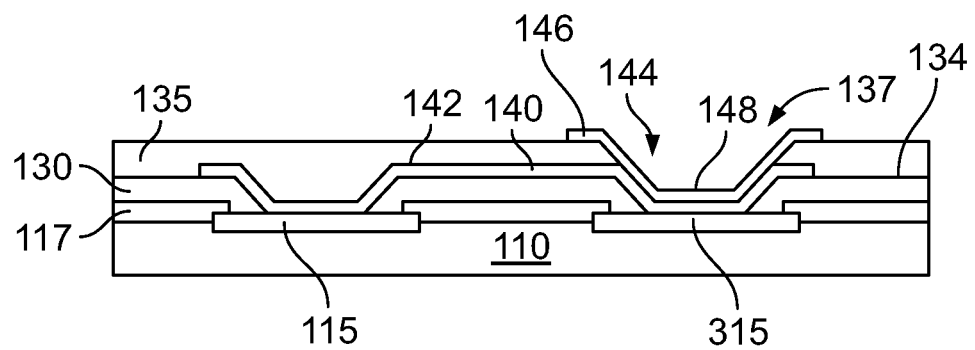

As shown in FIG. 4E, a second insulation layer 135 having a predetermined thickness can be formed over the first insulation layer 130 and the conductive trace 140. The second insulation layer 135 having a predetermined thickness can be formed by molding, printing, spin coating, or dispensing at least one material selected from the group consisting of an epoxy molding compound (EMC), polyimide (PI), benzocyclobutene (BCB), polybenzoxazole (PBO), bismaleimidetriazine (BT), phenolic resin, and equivalents thereof, to the first insulation layer 130, and the conductive trace 140.

The second insulation layer 135 can be masked and etched to expose an upper surface 148 of the cap layer 146 positioned above the dummy pad 315. See, FIG. 4F. As further shown in FIG. 4F, a cap layer 146 or UBM can be formed over land portion 144 of the conductive trace 140, and can extend to cover a portion of second insulation layer 135 around a periphery of land portion 144. The cap layer 146 can aid in later attachment of interconnection structure 160 to the land portion 144. The cap layer 146 can be formed by depositing a metal on the land portion 144 of the conductive trace 140 using sputtering, chemical vapor deposition (CVD), or plasma enhanced chemical vapor deposition (PECVD).

Figure 4G:
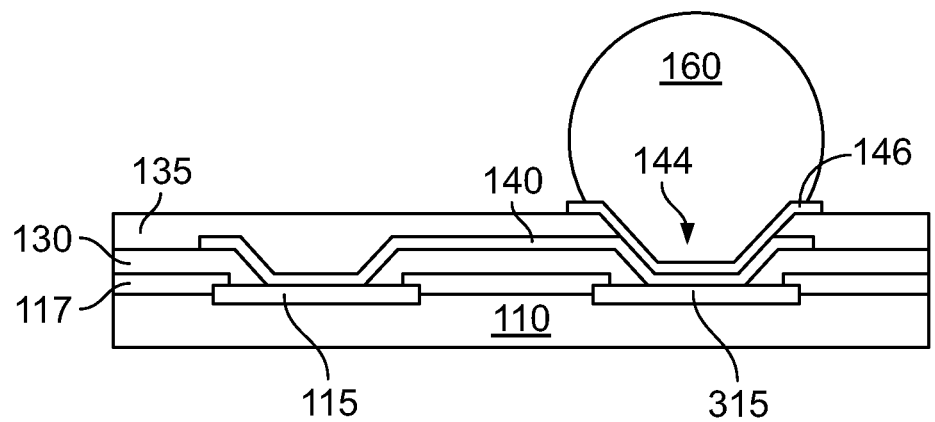

As shown in FIG. 4G, an interconnection structure 160 can be attached to the land portion 144 via the cap layer 146. In particular, the interconnection structure 160 can include a substantially spherical solder ball fusibly attached to the cap layer 146 over the land portion 144. In an exemplary embodiment, a viscous flux (not shown) can be applied to the cap layer 146 for positioning a solder ball thereon. Then, the semiconductor die 110 can be placed into a furnace maintained at a temperature ranging from about 150° C. to about 250° C. and then taken out to evaporate the flux for removal, thereby fusibly attaching the spherical solder ball to the land portion 144 via the cap layer 146. There can also be embodiments where interconnection structure 160 can comprise a metallic pillar or post, such as a copper pillar, that can be placed or formed, such as by plating, over land portion 144.

The present disclosure provides exemplary embodiments. The scope of the present disclosure is not limited by these exemplary embodiments. Numerous variations, whether explicitly provided for by the specification or implied by the specification, such as variations in structure, dimension, type of material and manufacturing process, can be implemented by one skilled in the art in view of this disclosure.

What is claimed is:

1. A semiconductor device, comprising:
   a semiconductor die comprising a die top side and a die bottom side;
   a circuit integrated in the semiconductor die;
   a bond pad comprising a bond pad top side and bond pad bottom side, wherein the bond pad top side is on the die bottom side, and wherein the bond pad is electrically coupled to the circuit via the bond pad top side;
   a dummy pad comprising a dummy pad top side and dummy pad bottom side, wherein the dummy pad top side is on the die bottom side, and wherein the dummy pad is not electrically coupled to the circuit via the dummy pad top side;
   a redistribution structure comprising an insulation layer over the die bottom side and a conductive trace separated from the die bottom side by the insulation layer, wherein the conductive trace extends laterally over the die bottom side from a first conductive trace portion coupled to the dummy pad toward a second conductive trace portion coupled to the bond pad; and
   an interconnection structure coupled to the first conductive trace portion;
   wherein the dummy pad provides a first thermal path that follows a straight line from the die bottom side through the dummy pad to the interconnection structures;
   wherein the bond pad and the conductive trace provide a second thermal path between the semiconductor die and the interconnection structure; and
   wherein the first thermal path provides greater thermal conductivity between the semiconductor die and the interconnection structure than the second thermal path provides.

2. The semiconductor device of claim 1, wherein the dummy pad is in direct contact with the die bottom side.

3. The semiconductor device of claim 1, wherein:
   the redistribution structure comprises a second insulation layer on the conductive trace and the insulation layer; and
   the interconnection structure comprises a solder ball attached to the first conductive trace portion via an opening in the second insulation layer.

4. The semiconductor device of claim 1, wherein:
   the semiconductor die further comprises a passivation layer; and
   the passivation layer defines at least a portion of the die bottom side.

5. The semiconductor device of claim 4, wherein the passivation layer comprises a bond pad opening through which the bond pad is coupled to the second conductive trace portion and a dummy pad opening through which the dummy pad is coupled to the first conductive trace portion.

6. A method of fabricating a semiconductor device, comprising:
   providing a semiconductor die, a circuit integrated in the semiconductor die, and a bond pad, wherein the semiconductor die comprises a die top side and a die bottom side, wherein the bond pad comprising a bond pad top side and a bond pad bottom side, wherein the bond pad top side is on the die bottom side, and wherein the bond pad is electrically coupled to the circuit via the bond pad top side;
   forming a single insulation layer of a redistribution structure on the die bottom side such that a top side of the single insulation layer contacts the die bottom side;
   providing a thermal path structure comprising a thermal path structure top side and a thermal path structure bottom side, wherein the thermal path structure top side is coupled to the die bottom side;
   forming a conductive trace of the redistribution structure on the single insulation layer such that the conductive trace is separated from the die bottom side by the single insulation layer, a top side of the conductive trace contacts a bottom side of the single insulation layer, the conductive trace extends laterally over the die bottom side from a first conductive trace portion toward a second conductive trace portion, a top side of the first conductive trace portion is coupled to the thermal path structure bottom side, and a top side of the second conductive trace portion is coupled to the bond pad; and
   coupling an interconnection structure to a bottom side of the first conductive trace portion.

7. The method of claim 6, wherein forming the thermal path structure comprises forming a thermal pad that has a greater thermal conductivity than the single insulation layer.

8. The method of claim 6, wherein forming the thermal path structure comprises forming a dummy pad structure such that a dummy pad top side is on the die bottom side and the dummy pad is not electrically coupled to the circuit via the dummy pad top side.

9. A semiconductor device, comprising:
   a semiconductor die comprising a die top side and a die bottom side;
   a circuit integrated in the semiconductor die;
   a bond pad comprising a bond pad top side and a bond pad bottom side, wherein the bond pad top side is on the die bottom side, and wherein the bond pad is electrically coupled to the circuit via the bond pad top side;
   a redistribution structure comprising an insulation layer over the die bottom side and a conductive trace separated from the die bottom side by the insulation layer, wherein the insulation layer comprises an insulation layer top side and an insulation layer bottom side, wherein the insulation layer top side contacts the die bottom side and the insulation layer bottom side contacts a top side of the conductive trace, wherein the conductive trace extends laterally over the die bottom side from a first conductive trace portion toward a second conductive trace portion, and wherein a top side of the second conductive trace portion is coupled to the bond pad;
   a thermal path structure between the first conductive trace portion and the die bottom side, wherein the thermal path structure comprises a thermal path structure top side and a thermal path structure bottom side, the thermal path structure top side is coupled to the die bottom side, and the thermal path structure bottom side is coupled to a top side of the first conductive trace portion; and
   an interconnection structure coupled to a bottom side of the first conductive trace portion.

10. The semiconductor device of claim 9, wherein:
    the thermal path structure comprises a thermal pad that passes through the insulation layer; and
    the thermal pad has a higher thermal conductivity than the insulation layer.

11. The semiconductor device of claim 9, wherein the thermal path structure comprises a dielectric material having a higher thermal conductivity than the insulation layer.

12. The semiconductor device of claim 9, wherein:
    the semiconductor die further comprises a passivation layer;

the passivation layer defines at least a portion of the die bottom side; and the thermal path structure is in direct contact with the die bottom side.

13. The semiconductor device of claim 12, wherein the insulation top side contacts the passivation layer of the die bottom side.

14. The semiconductor device of claim 9, wherein:

the semiconductor die further comprises a passivation layer;

the passivation layer defines at least a portion of the die bottom side; and the passivation layer comprises an opening through which the bond pad is coupled to the second conductive trace portion.

15. The semiconductor device of claim 14, wherein:

the thermal path structure comprises a thermal pad that passes through the insulation layer;

the thermal pad comprises a pad top side and a pad bottom side;

the pad bottom side is in direct contact with the first conductive trace portion; and the pad top side is in direct contact with the passivation layer.

16. The semiconductor device of claim 9, wherein:

the redistribution structure comprises a second insulation layer on the conductive trace and the insulation layer; and the interconnection structure comprises a solder ball coupled to the first conductive trace portion via an opening in the second insulation layer.

17. The semiconductor device of claim 9, wherein:

the thermal path structure comprises a dummy pad;

the dummy pad comprises a dummy pad top side on the die bottom side;

the dummy pad is not electrically coupled to the circuit via the bond pad top side; and the dummy pad is in direct contact with the die bottom side.

18. The semiconductor device of claim 17, wherein:

the semiconductor die further comprises a passivation layer;

the passivation layer defines at least a portion of the die bottom side; and the passivation layer comprises a bond pad opening through which the bond pad is coupled to the second conductive trace portion and a dummy pad opening through which the dummy pad is coupled to the first conductive trace portion.

19. The semiconductor device of claim 9, wherein:

the thermal path structure and the conductive trace provide a thermal path from the die bottom side to the interconnection structure; and the thermal path provides an all metallic path along a single, straight line from the die bottom side to the interconnection structure.

20. A semiconductor device, comprising:

a semiconductor die comprising a die top side and a die bottom side;

a circuit integrated in the semiconductor die;

a bond pad comprising a bond pad top side and a bond pad bottom side, wherein the bond pad top side is on the die bottom side, and wherein the bond pad is electrically coupled to the circuit via the bond pad top side;

a redistribution structure comprising an insulation layer over the die bottom side and a conductive trace separated from the die bottom side by the insulation layer, wherein the insulation layer comprises an insulation layer top side and an insulation layer bottom side, wherein the insulation layer top side contacts the die bottom side and the insulation layer bottom side contacts a top side of the conductive trace, wherein the conductive trace extends laterally over the die bottom side from a first conductive trace portion toward a second conductive trace portion, and wherein a top side of the second conductive trace portion is coupled to the bond pad;

a thermal path structure between the first conductive trace portion and the die bottom side, wherein the thermal path structure comprises a thermal path structure top side and a thermal path structure bottom side, the thermal path structure top side is coupled to the die bottom side, and the thermal path structure bottom side is coupled to a top side of the first conductive trace portion; and an interconnection structure coupled to a bottom side of the first conductive trace portion, wherein:

the thermal path structure and the conductive trace provide a first thermal path from the die bottom side to the interconnection structure;

the bond pad and the conductive trace provide a second thermal path between the semiconductor die and the interconnection structure; and the first thermal path provides greater thermal conductivity between the semiconductor die and the interconnection structure than the second thermal path provides.

21. The semiconductor device of claim 20, wherein:

the semiconductor die further comprises a passivation layer;

the passivation layer defines at least a portion of the die bottom side; and the thermal path structure is in direct contact with the die bottom side.

22. The semiconductor device of claim 20, wherein:

the redistribution structure comprises a second insulation layer on the conductive trace and the insulation layer; and the interconnection structure comprises a solder ball coupled to the first conductive trace portion via an opening in the second insulation layer.

23. The semiconductor device of claim 20, wherein:

the thermal path structure comprises a dummy pad;

the dummy pad comprises a dummy pad top side on the die bottom side;

the dummy pad is not electrically coupled to the circuit via the bond pad top side; and the dummy pad is in direct contact with the die bottom side.

* * * * *